United States Patent [19]

Kobari et al.

[11] Patent Number: 4,863,389

[45] Date of Patent: Sep. 5, 1989

[54] TERMINAL FOR CONNECTING ELECTRONIC COMPONENTS

[75] Inventors: Katsuo Kobari, Tachikawa; Naoto Ota, Oshino; Naoyuki Suzuki, Oshino; Yuji Kanamori, Oshino, all of Japan

[73] Assignee: Fanuc Ltd., Minamitsuru, Japan

[21] Appl. No.: 231,835

[22] PCT Filed: Dec. 18, 1987

[86] PCT No.: PCT/JP87/00996
§ 371 Date: Jul. 11, 1988
§ 102(e) Date: Jul. 11, 1988

[87] PCT Pub. No.: WO88/04838
PCT Pub. Date: Jun. 30, 1988

[30] Foreign Application Priority Data

Dec. 20, 1986 [JP] Japan ............................. 61-196208

[51] Int. Cl.⁴ ............................................. H01R 9/09
[52] U.S. Cl. ..................................... 439/83; 361/400
[58] Field of Search ............... 439/360, 361, 362, 363, 439/364, 55, 329, 801, 58, 78, 83; 361/400, 403, 404, 405

[56] References Cited

U.S. PATENT DOCUMENTS 3,624,588 11/1971 Farmer ................................. 439/83
4,136,924 1/1979 Dobrosielski et al. ............. 439/801

FOREIGN PATENT DOCUMENTS 57-14374 1/1982 Japan .
58-40603 9/1983 Japan .

Primary Examiner—Neil Abrams
Assistant Examiner—Khiem Nguyen
Attorney, Agent, or Firm—Staas & Halsey

[57] ABSTRACT

A connecting terminal for connecting an electronic component to a printed circuit board includes a rectangular metal plate and a leg provided at each of four corners thereof. The approximate center of the metal plate is provided with a screw hole through which a screw is passed that is screwed into a terminal of a screw terminal-type electronic component. The legs of the connecting terminal, which are passed through pin holes provided in the printed circuit board, are soldered to an electrical circuit and thereby fixed to the circuit board. A screw which is screwed into the terminal of the screw terminal-type electronic component is passed through the screw hole of the connecting terminal. When the screw is tightened, the electronic component is secured to the printed circuit board.

10 Claims, 1 Drawing Sheet

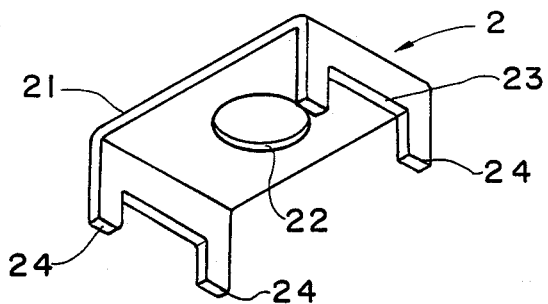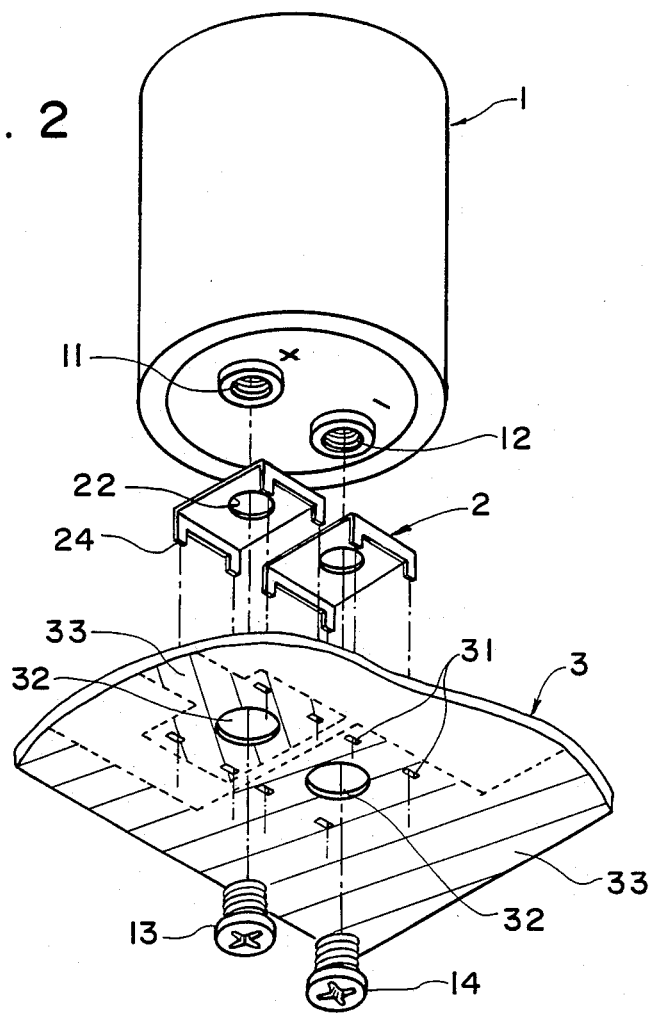

TERMINAL FOR CONNECTING ELECTRONIC COMPONENTS

BACKGROUND OF THE INVENTION

1. Field of the Invention

This invention relates to an electronic component connecting terminal for mounting a screw terminal-type electronic component, particularly a screw terminal-type capacitor, on a printed circuit board.

2. Description of the Related Art

Small capacitors are mounted with their lead terminals directly soldered to the printed pattern on a printed circuit board. A "printed circuit board" is an insulated board on which an electrical circuit including electronic components is wired in the form of copper foil lines. When it is attempted to connect a large capacitor having screw terminals to a printed circuit board by screwing, the portions of the printed circuit board at which the screws are tightened crack because the circuit board has insufficient strength. As a result, there are instances where the capacitor falls off the printed circuit board. In order to prevent such an accident from occurring, ordinarily the screw terminal-type capacitor is screwed down on a separate mounting frame, the mounting frame is secured to the printed circuit board, and an electrical circuit is constructed by making a connection to the wiring copper foil on the printed circuit board by means of connecting wires.

Since the screw terminal-type capacitor is large in size and weight, it is difficult to directly mount the capacitor on the printed circuit board by screwing, as mentioned above. In the case where the capacitor is screwed down on the separate frame and the frame is attached to the printed circuit board, the capacitor terminals and the electrical circuit on the printed circuit board cannot be soldered. Consequently, connecting wires for connecting the terminals and the circuit are required, the assembly operation necessitates labor, and automation of assembly of the printed wiring circuit is impaired.

SUMMARY OF THE INVENTION

The present invention has been devised in view of the above-noted problems. An object, therefore, is to provide an electronic component connecting terminal in which a connecting terminal for direct soldering is attached to a printed circuit board. A screw terminal of an electronic component is screwed down to this connecting terminal, thereby eliminating the drawbacks of the prior art.

In accordance with the present invention, there is provided an electronic component connecting terminal in which each of the four corners of a rectangular plate provided with a screw hole for being screwed to a terminal of a screw terminal-type electronic component is provided with a leg which is passed through a printed circuit board and soldered to a printed pattern.

According to one embodiment of the invention, the legs of the terminal for connecting the electronic component are soldered to the printed circuit board, and the terminal of the electronic component is screwed to the connecting terminal. As a result, a large-size electronic component can be mounted on the printed circuit board with ease.

According to the invention, the terminal for connecting the electronic component is rectangular in shape. Therefore, the electronic component can be fixed to the printed circuit board strongly by arranging the longitudinal direction of the connecting terminal at right angles to the direction of a line connecting the two terminals of the electronic component.

BRIEF DESCRIPTION OF THE DRAWINGS

FIG. 1 is a perspective view illustrating a preferred embodiment of a terminal for connecting an electronic component according to the invention, and FIG. 2 is an exploded view illustrating assembly using the FIG. 1 embodiment.

DETAILED DESCRIPTION OF THE PREFERRED EMBODIMENTS

A preferred embodiment of the present invention will now be described in detail with reference to the drawings.

FIG. 1 is a perspective view illustrating an embodiment of a terminal for connecting an electronic component, and FIG. 2 is a view for describing assembly using the terminal of FIG. 1.

In FIGS. 1 and 2, numeral 1 denotes a screw terminal-type capacitor in which an electrolytic capacitor is sealed within a cylindrical aluminum case, by way of example. An anode and cathode of the electrolytic capacitor are respectively connected to screw terminals 11, 12 provided on the bottom side of the capacitor.

Numeral 2 denotes a terminal or connector for connecting the capacitor. The terminal is made of an electrically conductive material such as brass, and has a rectangular top plate 21 formed into the shape of a table having four legs, the top plate being provided with a screw hole 22. A skirt portion 23 having a predetermined height is provided between the two legs of the shorts sides of the top plate 21. When the legs 24 are inserted into pin holes in the printed circuit board 3, the skirt portions 23 abut against the surface of the printed circuit board to set the height of the capacitor connecting terminal 2.

The connecting terminals 2 attached to the printed circuit board 3 with the longitudinal direction of the top plates 21 arranged at right angles to the central axes of the terminals 11 and 12 of the capacitor 1. As a result, the arrangement is such that stress acting upon the soldered portions, described below, is reduced, while the capacitor can be secured strongly without causing damage to copper foil at the soldered portions.

Numeral 31 denotes a pin hole provided in the printed circuit board 3 at a position corresponding to the location at which the capacitor 1 is mounted. These pin holes 31 are provided at eight locations corresponding to the positions of the eight legs 24 of the two capacitor connecting terminals 2. Bolt holes shown at numeral 32 are for receiving bolts 13, 14 passed therethrough and tightened in the screw terminals 11, 12. Accordingly, the diameter of the bolt hole 32 is made larger than the diameter of the head portion of each of the bolts 13, 14.

Numeral 33 denotes a wiring pattern comprising copper foil. The wiring pattern is formed on the surface of the printed circuit board based on a predetermined electrical circuit and is soldered to the legs 24 passed through the pin holes 31, thereby electrically connecting the legs 24 to the wiring pattern and fixing the capacitor connecting terminals 2 to the printed circuit board 3.

An assembly operation using the present embodiment will now be described. First, the capacitor connecting terminals 2 are attached to the printed circuit board 3. The legs 24 are inserted into corresponding pin holes 31, and the tips of the inserted legs 24 are soldered to the wiring pattern 33 adjacent the pin holes 31. Next, the capacitor 1 is placed at a predetermined position on the top plate 21 of each of the capacitor connecting terminals 2, and the terminals are fastened to the respective screw terminals 11, 12 from below by the bolts 13, 14 via the bolt holes 32 and screw holes 22. This secures the capacitor 1 to the printed circuit board 3 and connects it to the predetermined wiring pattern.

Though the present invention has been described in conjunction with an embodiment, the capacitor in the foregoing embodiment may be an electronic component such as a circuit breaker or a large transistor. The invention can be modified in various ways without departing from the scope of the claims.

In accordance with the present invention, a terminal for connecting an electronic component is soldered to a printed circuit board, whereby a large electronic component can be mounted on the printed circuit board by being fastened with screws. Accordingly, the soldering of this component can readily be performed in a soldering bath along with other electronic components. As a result, the screw fastening operation is simple and the assembly process is also simplified, thus making it possible to facilitate automation.

Since other frames and connecting wires are unnecessary, cost and labor requirements are reduced and maintenance is simplified.

We claim:

1. A terminal for connecting an electronic component having at least one screw terminal and a screw receivable in each screw terminal to a printed circuit board having a circuit pattern printed thereon and for connecting the electronic component to the circuit pattern, comprising:
    a rectangular metal plate for each of the at least one screw terminals and having an upper surface for mounting the electronic component thereto and a lower surface;
    a screw hole provided substantially centrally in each said rectangular metal plate and through which the screw passes for screwing into the at least one screw terminal of the electronic component; and
    a plurality of legs extending outwardly from the lower surface of each said rectangular metal plate in a direction perpendicular to a surface of said metal plate, said legs passing through the printed circuit board and being solderable to the circuit pattern.

2. A terminal according to claim 1, wherein said electronic component has two terminals, and said metal plates being oriented on said printed circuit board with a longitudinal direction of said metal plates at right angles to central axes of of both screw terminals of said electronic component.

3. A terminal according to claim 1, wherein said electronic component is a screw terminal-type capacitor.

4. A terminal according to claim 1, wherein the rectangular metal plate has four corners, and the plurality of legs comprises four legs, one leg being provided at each of the four corners of the rectangular metal plate.

5. A terminal according to claim 4, wherein the metal plate further includes two skirts, each being disposed between two of the four legs, and each skirt having a predetermined height for spacing the metal plate above the printed circuit board.

6. An electronic assembly comprising:
    a printed circuit board having a circuit pattern printed thereon;
    at least one electronic component having at least one screw terminal and a screw receivable in each screw terminal; and
    a connector for each screw terminal and having a rectangular metal plate which has an upper surface for mounting the at least one electronic component thereto and a lower surface, a screw hole provided substantially centrally in the rectangular metal plate, and a plurality of legs extending outwardly from the lower surface of the rectangular metal plate;
    the printed circuit board having a screw hole corresponding to each screw terminal for each electronic component, and a set of pin holes in the printed circuit board disposed around each printed circuit board screw hole and being spaced to correspond to the legs of each connector which pass through the pin holes for soldering the connector to the printed circuit board;
    each screw passing through the printed circuit board screw hole and being receivable in the rectangular metal plate screw hole and the corresponding screw terminal of the electronic component to fasten the electronic component to the upper surface of the rectangular metal plate.

7. An electronic assembly according to claim 6, wherein the at least one electronic component has two terminals.

8. An electronic assembly according to claim 6, wherein the at least one electronic component comprises at least one screw terminal-type capacitor.

9. An electronic assembly according to claim 6, wherein the rectangular metal plate has four corners, and the plurality of legs comprises four legs, one leg being provided at each of the four corners of the rectangular metal plate.

10. A electronic assembly according to claim 9, wherein the rectangular metal plate further includes two skirts, each being disposed between two of the four legs, each skirt having a predetermined height for spacing the metal plate above the printed circuit board.

* * * * *